United States Patent
Zhao et al.

(10) Patent No.: US 7,377,025 B2
(45) Date of Patent: May 27, 2008

(54) METHOD OF FORMING AN IMPROVED AP1 LAYER FOR A TMR DEVICE

(75) Inventors: Tong Zhao, Fremont, CA (US); Chyu-Jiuh Torng, Pleasanton, CA (US); Hui-Chuan Wang, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 439 days.

(21) Appl. No.: 10/977,636

(22) Filed: Oct. 29, 2004

(65) Prior Publication Data

US 2006/0092578 A1 May 4, 2006

(51) Int. Cl.
*G11B 5/193* (2006.01)
*C23C 14/48* (2006.01)

(52) U.S. Cl. .............. 29/603.14; 29/603.12; 29/603.16; 29/603.18; 204/192.2; 204/192.34; 360/324.11; 360/324.12; 360/327.22

(58) Field of Classification Search ............. 29/603.12, 29/603.13, 603.14, 603.15, 603.16, 603.18; 204/192.2, 192.15, 192.34; 360/324.1, 324.11, 360/324.12, 327.22
See application file for complete search history.

(56) References Cited

U.S. PATENT DOCUMENTS

| | | | |
|---|---|---|---|
| 6,347,049 B1 | 2/2002 | Childress et al. | 365/173 |
| 6,452,204 B1 | 9/2002 | Ishiwata et al. | 257/9 |
| 6,483,675 B1 | 11/2002 | Araki et al. | 360/324.2 |
| 6,548,114 B2 * | 4/2003 | Mao et al. | 360/324.1 |
| 6,655,006 B2 | 12/2003 | Pinarbasi | 29/603.07 |
| 6,735,058 B2 | 5/2004 | Lin et al. | 360/319 |
| 6,759,081 B2 | 7/2004 | Huganen et al. | 427/58 |
| 2002/0003684 A1 | 1/2002 | Nakashio et al. | 360/324.2 |

FOREIGN PATENT DOCUMENTS

JP 8-147638 * 6/1996

OTHER PUBLICATIONS

Song et al., "Demonstrating a Tunneling Magneto-Resistive Read Head," IEEE Trans. on Magnetics, vol. 36, No. 5, Sep. 2000, pp. 2545-2548.

Ohashi et al., "Low Resistance Tunnel magneto resistive Head," IEEE Trans. on Magnetics, vol. 36, No. 5, Sep. 2000, pp. 2549-2553.

Freitas et al., "Spin Dependent Tunnel Junctions for Memory and Read-Head Applications," IEEE Trans. on Magnetics, vol. 36, No. 5, Sep. 2000, pp. 2796-2801.

* cited by examiner

*Primary Examiner*—A. Dexter Tugbang
(74) *Attorney, Agent, or Firm*—Saile Ackerman LLC; Stephen B. Ackerman

(57) ABSTRACT

A TMR read head with improved voltage breakdown is formed by laying down the AP1 layer as two or more layers. Each AP1 sub-layer is exposed to a low energy plasma for a short time before the next layer is deposited. This results in a smooth surface, onto which to deposit the tunneling barrier layer, with no disruption of the surface crystal structure of the completed AP1 layer.

10 Claims, 1 Drawing Sheet

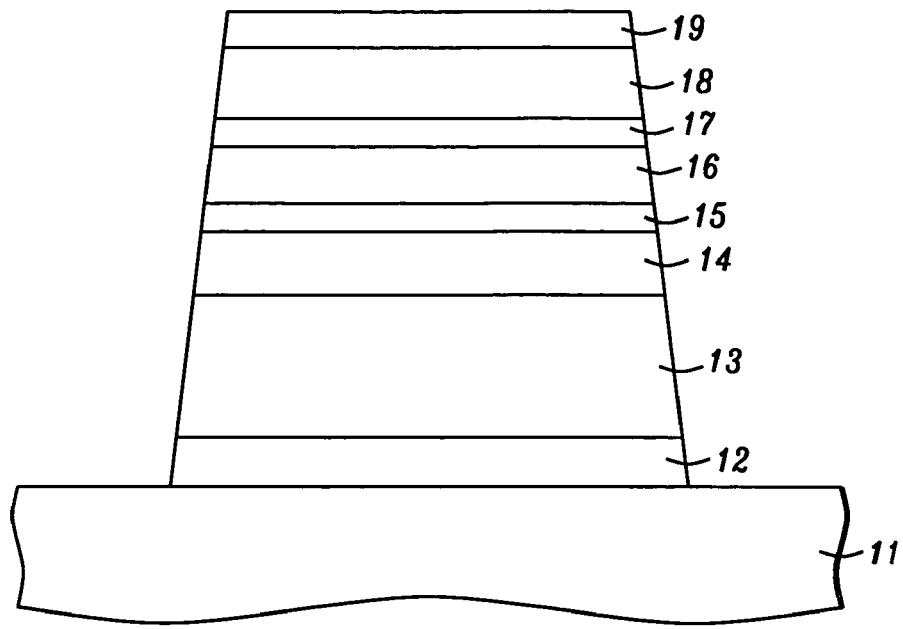
*FIG. 1 – Prior Art*
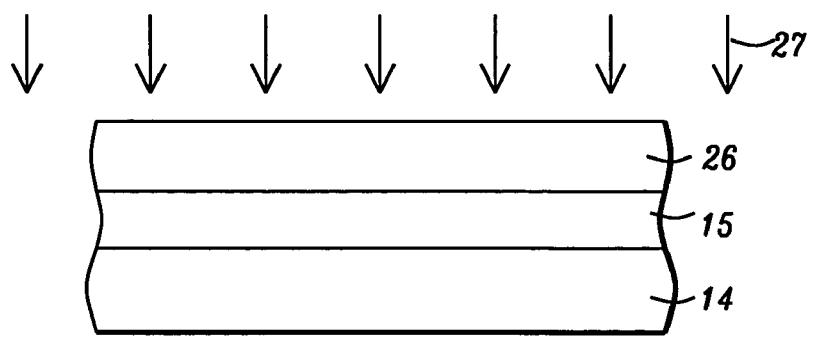
*FIG. 2*
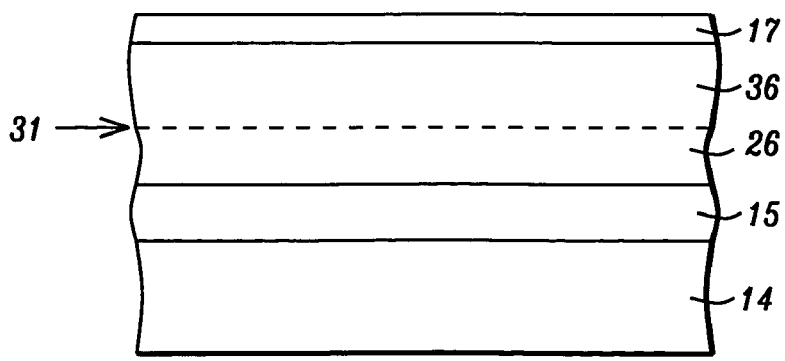
*FIG. 3*

METHOD OF FORMING AN IMPROVED AP1 LAYER FOR A TMR DEVICE

FIELD OF THE INVENTION

The invention relates to the general field of magnetic read heads with particular reference to the formation and structure of AP1 in magnetic tunnel junctions.

BACKGROUND OF THE INVENTION

The principle governing the operation of most magnetic read heads is the change of resistivity of certain materials in the presence of a magnetic field (magneto-resistance or MR). Magneto-resistance can be significantly increased by means of a structure known as a spin valve where the resistance increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

The key elements of a spin valve are a seed layer on which is an antiferromagnetic layer whose purpose is to act as a pinning agent for a magnetically pinned layer. Next is a copper spacer layer on which is a low coercivity (free) ferromagnetic layer. When this free layer is exposed to an external magnetic field, the direction of its magnetization is free to rotate according to the direction of the external field. After the external field is removed, the magnetization of the free layer will be at a direction, which is dictated by the minimum energy state, determined by the crystalline and shape anisotropy, current field, coupling field and demagnetization field.

If the direction of the pinned field is parallel to the free layer, electrons passing between the free and pinned layers suffer less scattering. Thus, the resistance in this state is lower. If, however, the magnetization of the pinned layer is anti-parallel to that of the free layer, electrons moving from one layer into the other will suffer more scattering so the resistance of the structure will increase.

A related effect to the GMR phenomenon described above is tunneling magnetic resistance (TMR) in which the layer that separates the free and pinned layers is a non-magnetic insulator, such as alumina or silica. Its thickness needs to be such that it will transmit a significant tunneling current.

An MTJ (magnetic tunnel junction) is readily visualized by substituting a dielectric layer for the spacer layer described above for the GMR device. The principle governing the operation of the MTJ in magnetic read sensors is the change of resistivity of the tunnel junction between two ferromagnetic layers when it is subjected to a bit field from magnetic media. When the magnetizations of the pinned and free layers are in opposite directions, the tunneling resistance increases due to a reduction in the tunneling probability. The change of resistance is typically 40%, which is much larger than for GMR devices.

FIG. 1 shows a schematic cross-sectional view of a typical TMR structure. Seen there are substrate 11 on which lies seed layer 12 of a material such as NiCr or Ta. Antiferromagnetic layer 13, typically IrMn or PtMn between about 20 and 200 Angstroms thick is next. Instead of a single pinned layer, a complex of three layers is commonly used. These are soft ferromagnetic layers 14 and 16 that are magnetized in mutually antiparallel directions and are separated by antiferromagnetic coupling layer 15 (of a material such as CoFe). Conventionally, layers 14 and 16 are referred to as AP2 and AP1 respectively. Tunneling layer 17 rests on AP1 and is itself coated by free layer 18. Capping layer 19 completes the structure.

For a TMR sensor, it is essential that AP1 provide a smooth surface for the barrier layer to grow on since a rough lead/barrier interface will usually cause high interlayer coupling and low breakdown voltage, especially for the thin aluminum oxide layer that is commonly used Conventional techniques, such as a plasma treatment of AP1, introduce new problems. In particular, although such treatment does provide a topographically smoother surface for the barrier layer to grow on, it can also disrupt the atomic ordering at the interface between AP1 and the barrier layer, resulting in a decrease in the TMR ratio.

The present invention teaches how effective smoothing of the upper surface of AP1 can be achieved without any disruption of the atomic ordering at that surface.

A routine search of the prior art was performed with the following patent references being considered as being of interest:

Ishiwata et al., in "Tunneling magnetoresistance transducer and method for manufacturing the same", U.S. Pat. No. 6,452,204 (Sep. 17, 2002), teach the inclusion of a thin nitrided layer between the free and pinned layers. Childress, et al., "Low resistance magnetic tunnel junction with bilayer or multilayer tunnel barrier", U.S. Pat. No. 6,347,049 (Feb. 12, 2002), teach a barrier layer that is made up of two or more separately deposited insulating layers while in "Method of making a tunnel junction with a smooth interface between a pinned or free layer and a barrier layer", U.S. Pat. No. 6,655,006 (Dec. 2, 2003), Pinarbasi teaches smoothing of the surface onto which the barrier layer is to be deposited, by briefly exposing it to low pressure oxygen.

The following published articles were also found to be of interest:

1) K. Ohashi et al. "Low-Resistance Tunnel Magnetoresistive Head" IEEE Transactions On Magnetics, Vol. 36, No. 5, 2000, p 2549.

2) P. P. Freitas et al., "Spin-dependent Tunnel Junctions for Memory and Read-Head applications", IEEE Transactions On Magnetics, Vol. 36, No. 5, 2000, p 2796.

3) Dian Song et al., "Demonstrating a Tunneling Magneto-Resistive Read Head", IEEE Transactions On Magnetics, Vol. 36, No. 5, 2000, p 2545.

SUMMARY OF THE INVENTION

It has been an object of at least one embodiment of the present invention to provide a TMR read head an having improved barrier breakdown without performance loss.

Another object of at least one embodiment of the present invention has been to provide a process for manufacturing said read head.

Still another object of at least one embodiment of the present invention has been that said process not require significant changes to current processes for TMR read head manufacture.

A further object of at least one embodiment of the present invention has been to enable performance tuning of the pinned layer and the barrier to be performed separately.

These objects have been achieved by forming the AP1 layer from two or more layers. Each layer (except the uppermost one that will interface with the tunneling layer) is exposed to a low energy plasma for a short time before the next layer is laid down. This results in a smooth surface, onto which to deposit the tunneling barrier layer, with no disruption of the surface crystal structure. This leads to TMR devices with improved breakdown voltages. Additionally, the structure of the AFM layer, as influenced by the AFM coupling layer, and the growth of the barrier layer, as modulated by the plasma treatment, can be independently adjusted, which means that both strong pinning and a smooth barrier can be simultaneously realized. A process for manufacturing the device is described. Said process requires minimal changes to current manufacturing processes for TMR devices.

BRIEF DESCRIPTION OF THE DRAWINGS

FIG. 1 shows a typical TMR device of the prior art.
FIG. 2 illustrates a key step in the process of the invention.
FIG. 3 shows the novel portion of the invented structure.

DESCRIPTION OF THE PREFERRED EMBODIMENTS

The basic requirements for TMR sensors are as follows:
1) Low areal resistance (RA).
2) High MR ratio
3) Magnetically soft free layer having low magnetostriction
4) Low interlayer coupling through barrier layer.
5) Strong pinned layer.

To meet the requirement of low RA (less than 10 ohm.$\mu m^2$), the tunnel barrier has to be very thin; for example, less than 8 Å for an alumina barrier. Two major issues related to thin barriers are 1) higher pinhole density may cause stability problems for TMR sensors, and 2) large interlayer coupling may decrease the sensitivity of the TMR sensor. So it is essential to have a smooth underlying ferromagnetic layer on which to deposit the tunnel barrier layer.

The present invention teaches how to achieve smoother barrier growth without sacrificing other requirements of the TMR sensor such as maintaining the atomic ordering at the interface between AP1 and the barrier layer. We will illustrate the structure of the present invention though a description of a process for its manufacture. As this process description proceeds, the structure of the invention will also become clear.

Referring initially to FIG. 1, the process of the invention begins with the provision of substrate 11 and depositing thereon seed layer 12. This is followed by the deposition of antiferromagnetic layer 13 on seed layer 12. Then, AP2 layer 14 is deposited onto layer 13. AP2 has the form of a layer of magnetically soft ferromagnetic material and is magnetically coupled to layer 13. Its deposition is followed by the depositing onto it of antiferromagnetic coupling layer 15.

Under prior art practice, AP1 would be deposited next as a single layer similar to AP2 in both composition and thickness. Instead, as a key novel feature of the invention, less than the intended final thickness of AP1 is laid down as layer 26 (as can be seen in FIG. 2). Layer 26 is a magnetically soft material such as CoFe, NiFe, or CoNiFe and it is deposited to a thickness between about 5 and 40 Angstroms Typically, the top surface of layer 26 would have a surface roughness value of about 4 to 8 Angstroms.

In a second key step of the invention, the surface of layer 26 is exposed to a gaseous plasma whose low energy ions 27 bombard the surface of 26, thereby smoothing it. This smoothing action arises because the bombarding ions preferentially removes the peaks.

To ensure little or no change in the mean thickness of 26, the energy of the bombarding ions is kept to less than about 50 volts and the duration of exposure to the plasma is kept to less than about 100 seconds. The bombarding ions can be provided through conventional sputtering (DC or RF) or by means of an ion beam. At the conclusion of the plasma treatment, the surface roughness of layer 26 will have been reduced to less than about 2 Å

Referring next to FIG. 3, the formation of AP1 is completed with the deposition onto plasma smoothed surface 31 of additional magnetically soft material layer 36. Layer 36 could be any of CoFe, NiFe, or CoNiFe and it is deposited to a thickness between about 5 and 40 Angstroms. It is also possible, in the general case, to form AP1 out of three or more layers, with each successive layer except the last being given a plasma smoothing step prior to the deposition of the next layer. Regardless of how many layers are used to form AP!, its total thickness should be between about 10 and 80 Angstroms. Note, too, that different materials may be used for the various sub-layers making up AP1.

The process concludes with the deposition of tunnel barrier layer 17 onto AP! followed by the deposition of free layer 18 and capping layer 19. It should be noted that the key feature of exposure to a plasma can be done in the same chamber as the formation of the barrier layer through oxidation. Similarly, all annealing ateps that are part of the overall process can be kept the same. Thus, the invention requires that no changes be made to the process flow and related process relative to current practice.

Another advantage of the new TMR structure is that the structure of the AFM layer, as influenced by the AFM coupling layer, and the growth of the barrier layer, as modulated by the plasma treatment, can be independently adjusted, which means that both strong pinning and a smooth barrier can be simultaneously realized.

Confirmatory Results

We present below some experimental data that confirm the effectiveness of the invention:

The properties of a 0.6 µm circle device having a TMR structure of A or B below were compared in TABLE I:

TABLE I

A)Seed layer\Antiferromagnetic layer\CoFe\Ru\CoFe\AlOx\CoFe\NiFe\Capping layer.
B)Seed layer\Antiferromagnetic layer\CoFe\Ru\CoFe\PT\CoFe\AlOx\ CoFe\NiFe\Cap

| Sample | RA  | dR/R  | Hin (Oe) | HBD (%) |
|--------|-----|-------|----------|---------|
| A      | 3.7 | 19.1% | 47       | 40      |
| B      | 3.9 | 18.3% | 25       | 53      | where PT = plasma treatment;
HBD = percentage of devices having breakdown voltage higher than 0.6 volts of the total number of measured devices.

Breakdown measurement was performed on 0.3 µm circle devices.

These improved junction properties indicate smoother barriers and less pinhole density.

In TABLE II, the properties of 0.6 µm circle devices with TMR structure of C) and D) are similarly compared:

TABLE II

| | C) Seed layer\Antiferromagnetic layer\CoFe\Ru\CoFe\AlOx\CoFe\NiFe\Capping layer. D) Seed layer\Antiferromagnetic layer\CoFe\Ru\CoFe\PT\AlOx\CoFe\NiFe\Cap | | |
|---|---|---|---|
| Sample | RA | dR/R | Hin (Oe) |
| C | 2.5 | 17.4% | 75 |
| D | 2.2 | 12.6% | 19 |

This confirms that, in the absence of a smoothing process for the AP1 multilayer structure, the associated atomic disorder causes a decrease in the MR ratio.

What is claimed is:

1. A method to form an AP1 layer for use in a magnetic tunnel junction, comprising:

providing an AP2 layer in the form of a first layer of soft magnetic material and depositing thereon an antiferromagnetic coupling layer;

depositing on said antiferromagnetic coupling layer, a first part of said AP1 layer in the form of a second layer of soft magnetic material having a top surface;

subjecting said top surface to bombardment by ions whose energy is less than about 50 volts for up to 100 seconds, thereby smoothing said top surface;

then depositing on said smoothed top surfaces a third layer of soft magnetic material, said second and third layers of soft magnetic material together becoming said AP1 layer; and then magnetizing said AP1 and AP2 layers into mutually antiparallel directions.

2. The method described in claim 1 wherein said first layer of soft magnetic material is selected from the group consisting of CoFe, NiFe, and CoNiFe.

3. The method described in claim 1 wherein said first layer of soft magnetic material is deposited to a thickness between about 10 and 80 Angstroms.

4. The method described in claim 1 wherein said second layer of soft magnetic material is selected from the group consisting of CoFe, NiFe, and CoNiFe.

5. The method described in claim 1 wherein said second layer of soft magnetic material is deposited to a thickness between about 5 and 40 Angstroms.

6. The method described in claim 1 wherein said third layer of soft magnetic material is selected from the group consisting of CoFe, NiFe, and CoNiFe.

7. The method described in claim 1 wherein said third layer of soft magnetic material is deposited to a thickness between about 5 and 40 Angstroms.

8. The method described in claim 1 wherein said AP1 layer has a total thickness of between about 10 and 80 Angstroms.

9. The method described in claim 1 wherein said second and third layers of soft magnetic material are of different materials.

10. The method described in claim 1 further comprising depositing one or more additional layers of soft magnetic material, each of whose top surfaces are bombarded by said ions, in order to form said AP1 layer.

* * * * *

UNITED STATES PATENT AND TRADEMARK OFFICE
CERTIFICATE OF CORRECTION

PATENT NO. : 7,377,025 B2  Page 1 of 1
APPLICATION NO. : 10/977636
DATED : May 27, 2008
INVENTOR(S) : Tong Zhao et al.

It is certified that error appears in the above-identified patent and that said Letters Patent is hereby corrected as shown below:

On the Title Page item (75), delete Inventor, "Tong Zhao, Fremont, CA (US)" and replace with -- Tong Zhao, Milpitas, CA (US) --.

Signed and Sealed this

Fifth Day of August, 2008

JON W. DUDAS
*Director of the United States Patent and Trademark Office*